United States Patent
Hess et al.

(10) Patent No.: US 9,383,405 B2
(45) Date of Patent: Jul. 5, 2016

(54) TRANSIENT VOLTAGE SUPPRESSION PROTECTION CIRCUIT INCLUDING BUILT IN TESTING

(71) Applicant: Hamilton Sundstrand Corporation, Windsor Locks, CT (US)

(72) Inventors: Gary L. Hess, Enfield, CT (US); James Quigley, Jr., Windsor Locks, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 432 days.

(21) Appl. No.: 13/859,810

(22) Filed: Apr. 10, 2013

(65) Prior Publication Data

US 2014/0306714 A1 Oct. 16, 2014

(51) Int. Cl.
*H02H 9/04* (2006.01)
*G01R 31/28* (2006.01)

(52) U.S. Cl.
CPC ........... *G01R 31/2827* (2013.01); *H02H 9/041* (2013.01); *H02H 9/042* (2013.01)

(58) Field of Classification Search
None
See application file for complete search history.

(56) References Cited

U.S. PATENT DOCUMENTS

| | | | | |
|---|---|---|---|---|
| 4,271,446 A * | 6/1981 | Comstock | .............. | H02H 9/042 340/638 |
| 5,914,662 A * | 6/1999 | Burleigh | ................ | H02H 9/042 340/635 |
| 6,160,697 A * | 12/2000 | Edel | ..................... | G01R 15/185 361/143 |
| 6,522,517 B1 * | 2/2003 | Edel | ..................... | G01R 15/185 361/143 |
| 6,563,926 B1 * | 5/2003 | Pistilli | .................... | H02H 9/048 361/111 |
| 7,054,127 B1 * | 5/2006 | Scearce | .................. | H02H 9/044 361/119 |
| 7,742,267 B2 * | 6/2010 | Sieben | ................. | G01R 31/327 361/18 |
| 8,059,378 B2 | 11/2011 | Liu et al. | | |
| 8,164,876 B2 * | 4/2012 | Simi | ...................... | H02H 9/042 361/117 |
| 8,598,899 B2 | 12/2013 | Hess | | |
| 2005/0259373 A1 * | 11/2005 | Hoopes | .................. | H02H 3/207 361/90 |
| 2007/0002511 A1 | 1/2007 | Chaudhry | | |
| 2008/0019070 A1 * | 1/2008 | Kilroy | ...................... | H02H 9/04 361/100 |
| 2008/0106152 A1 | 5/2008 | Maier | | |
| 2008/0129113 A1 | 6/2008 | Robertson et al. | | |
| 2009/0207034 A1 * | 8/2009 | Tinaphong | ............. | H02H 9/042 340/635 |
| 2010/0023095 A1 * | 1/2010 | Stevenson | ................ | A61N 1/08 607/63 |
| 2010/0103580 A1 * | 4/2010 | Fitzpatrick | ............... | H04B 1/18 361/118 |
| 2010/0149709 A1 * | 6/2010 | Straka | .................... | H02H 9/041 361/91.1 |
| 2010/0172063 A1 * | 7/2010 | Liu | .......................... | H02H 1/04 361/118 |

(Continued)

OTHER PUBLICATIONS

European Search Report for European Patent Application No. 14161243.2 competed Jun. 16, 2014.

*Primary Examiner* — Jermele M Hollington
*Assistant Examiner* — Suresh K Rajaputra
(74) *Attorney, Agent, or Firm* — Carlson, Gaskey & Olds, P.C.

(57) ABSTRACT

A lightning protection circuit includes a first lightning protection branch including at least one transient voltage suppression (TVS) protection element, and a testing element integral to the lightning protection circuit. The testing element is operable to test a functionality of the lightning protection circuit while he lightning protection circuit is installed in an electronic control system. A controller is connected to the testing element, such that the controller receives sensed signals from the testing element.

10 Claims, 4 Drawing Sheets

(56) References Cited

U.S. PATENT DOCUMENTS

| | | | |
|---|---|---|---|
| 2011/0242721 A1* | 10/2011 | Chen | H05K 1/0254 361/131 |
| 2012/0026639 A1* | 2/2012 | Wright | H02H 9/041 361/118 |
| 2012/0120535 A1* | 5/2012 | Bauer | H02H 9/049 361/91.5 |
| 2012/0187969 A1* | 7/2012 | Hess | H02H 9/042 324/750.3 |
| 2013/0100710 A1* | 4/2013 | Kang | H02H 9/04 363/21.12 |
| 2013/0229055 A1* | 9/2013 | Trumbo | H02H 9/04 307/18 |
| 2013/0258541 A1* | 10/2013 | Knobloch | H01B 7/2813 361/111 |

* cited by examiner

TRANSIENT VOLTAGE SUPPRESSION PROTECTION CIRCUIT INCLUDING BUILT IN TESTING

TECHNICAL FIELD

The present disclosure relates generally to lightning protection circuits for aircraft, and more specifically to a lightning protection circuit including a transient voltage suppression element and a built in testing functionality.

BACKGROUND OF THE INVENTION

Modern aircraft typically utilize multiple on-board electrical systems and controls during flight to ensure proper operation of the aircraft. One environmental risk aircraft are exposed to during flight is the potential of a lightning strike hitting the aircraft. When lightning strikes an aircraft, a surge of electricity passes through the aircraft and any unprotected electrical systems onboard the aircraft. The surge can overload unprotected electrical systems and damage or destroy the unprotected electrical system. This surge of electricity is referred to as a lightning transient surge. In order to protect against these lightning transient surges, aircraft include lightning protection circuits connected to one or more on board electrical systems. The lightning protection circuits shunt the lightning transient surge away from the protected electrical system, and to a neutral power line.

Some existing lightning protection circuits utilize a transient voltage suppression device as a clamping portion of the transient surge protection. Existing circuits utilizing this type of configuration do not have a way of testing the full functionality of a lightning protection circuit without removing the module containing the lightning protection circuit from the aircraft itself. As a result, the functionality of the lightning protection circuits is determined during maintenance and assumed to be maintained until the next maintenance. Verification of the functionality is then performed at the next maintenance when the module is removed from the aircraft.

SUMMARY OF THE INVENTION

Disclosed is a lightning protection circuit comprising: a first lightning protection branch including at least one transient voltage suppression (TVS) protection element, and a testing element integral to the lightning protection circuit, wherein the testing element is operable to test a functionality of the lightning protection circuit while the lightning protection circuit is installed in an electronic control system, and a controller connected to the testing element, such that the controller receives sensed signals from the testing element.

Also disclosed is a method for testing transient voltage suppression based lightning protection circuits without disconnecting the TVS circuit including the steps of: inverting a transient voltage suppression bias supply voltage and measuring an input to the lightning protection circuit and a transient voltage suppression wrap around voltage of the lightning protection circuit, analyzing the measured input to the lightning protection circuit and the measured transient voltage suppression wraparound voltage of the lightning protection circuit using a controller, and determining a functionality of a transient voltage suppression element in the lightning protection circuit and a functionality of a steering element in the lightning protection circuit.

Also disclosed is an aircraft power system including a power distribution system, at least one electrical system connected to, and receiving power from, the power distribution system, at least one lightning protection circuit connected to the power distribution in parallel with the electrical system, wherein the lightning protection circuit includes at least a first lightning protection branch including at least one transient voltage suppression (TVS) protection element and a testing element integral to the lightning protection circuit, wherein the testing element is operable to test a functionality of the first lightning protection branch while the lightning protection circuit is installed in the aircraft power system, and a controller connected to the testing element, such that the controller receives sensed signals from the testing element.

These and other features of the present invention can be best understood from the following specification and drawings, the following of which is a brief description.

DETAILED DESCRIPTION OF AN EMBODIMENT

Figure 1:
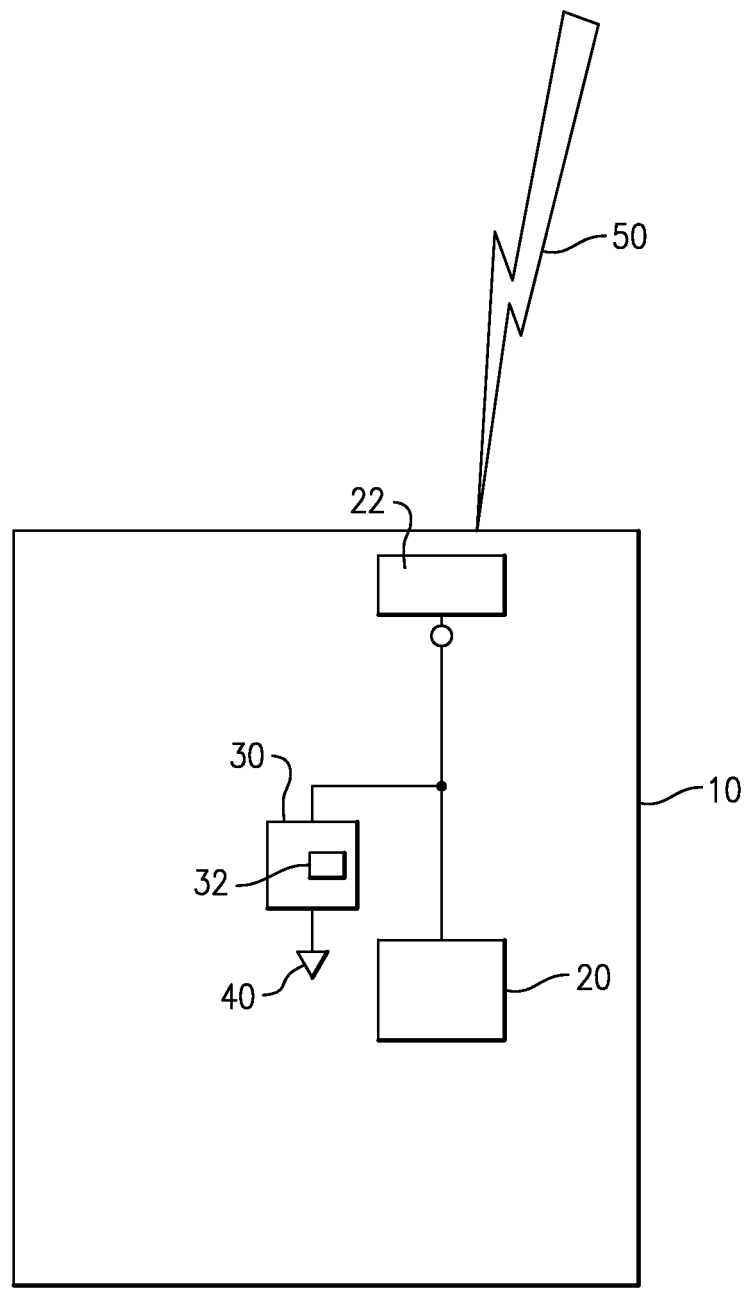
FIG. 1 schematically illustrates an aircraft including an electrical subsystem.

FIG. 1 schematically illustrates an aircraft 10 including an on-board electronic control system 20. The electronic control system 20 is representative of multiple different types of aircraft electronic control systems 20 that draw power from an aircraft power distribution system 22. Connected at the signal input and output pins of the electronic control systems 20 is a lightning protection device 30. The lightning protection device 30 shunts lightning transient voltage surges resulting from lightning strikes 50 to a neutral 40, thereby protecting the electronic control system 20.

The lightning protection device 30 includes a circuit having a transient voltage suppression (TVS) element 32. The transient voltage suppression element 32 is an electronic component that operates by shunting excess current when the induced voltage of a transient surge (such as from the lightning transient surge) exceeds an avalanche breakdown potential of the transient voltage suppression element 32. While illustrated in the example of FIG. 1 as a single element, it is understood that the transient voltage suppression element 32 can incorporate a single transient voltage suppression diode, multiple transient voltage suppression components in an array, or multiple transient voltage suppression components located in multiple protection circuit branches.

Figure 2:
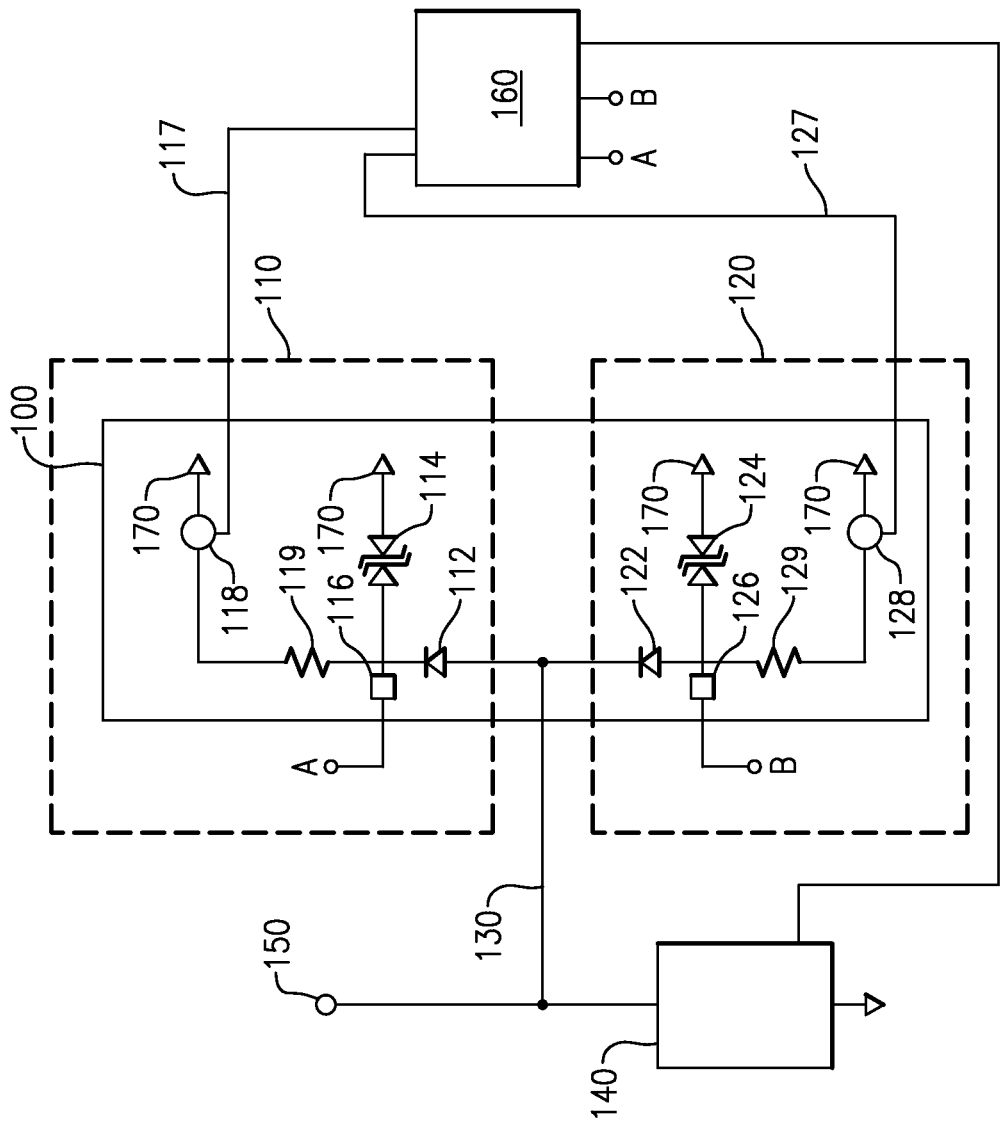
FIG. 2 schematically illustrates a lightning protection circuit for utilizing in the aircraft of FIG. 1.

FIG. 2 illustrates an example lightning protection circuit 100 in greater detail. The lightning protection circuit 100 includes two branches, a positive branch 110 for shunting positive transients, and a negative branch 120 for shunting negative transients. Each branch 110, 120 is connected to an input of the protected component (the electronic control system 20, illustrated in FIG. 1) at node 150 via an input line 130. Also connected to the input line 130 is an external sensor 140 that detects a voltage, relative to neutral, at a connection point 150. In some example embodiments, the external sensor 140 is a resistor divider sensor. Alternately, the external sensor 140 can be any type of sensor that detects the voltage, relative to neutral, of the input line 130.

Each branch 110, 120 of the lightning protection circuit 100 is connected to the input line 130 via a steering diode 112, 122. The steering diode 112, 122 ensures that the branch 110, 120 only admits the corresponding transient type. In addition, the steering diodes 112, 122 and bias resistors 119, 129 effectively minimize any effects from TVS leakage currents and TVS capacitance. By way of example, the steering diode 112 of the positive branch 110 is connected to the input line 130 via the anode of the steering diode 112. Conversely, the steering diode 122 of the negative branch 120 is connected to the input line 130 via the cathode of the steering diode 122. As a result of the inverted connections of the steering diodes 112, 122, positive transient surges from a lightning strike are blocked from entering the negative branch 120, and negative transient surges from lightning strikes are blocked from entering the positive branch 110.

Each steering diode 112, 122 is connected to a transient voltage suppression diode 114, 124 that provides a voltage clamping affect, allowing the lightning transient voltage surge to be shunted to a neutral. Also connected at the node connecting the steering diode 112, 122 to the transient voltage suppression diode 114, 124 is a switchable bias voltage source 118, 128. A positive switchable bias voltage source 118 ordinarily provides a positive bias voltage to the transient voltage suppression diode 114 through a bias resistor 119 in the positive branch 110. Similarly, a negative switchable bias voltage source 128 ordinarily provides a negative bias voltage to the transient voltage suppression diode 124, through a bias resistor 129, in the negative branch 120. Each of the switchable bias voltage sources 118, 128 provides the necessary bias voltage to the corresponding transient voltage suppression diode 114, 124 to place the corresponding transient voltage suppression diode 114, 124 in an avalanche mode.

The switchable bias voltage sources 118, 128 include control connections 117, 127 that allow a controller 160 to alter the bias voltage generated by the switchable bias voltage sources 118, 128 during a test of the functionality of the lightning protection circuit 100. In one example, the output voltage of the switchable bias voltage sources 118, 128 are inverted. In alternate systems, the output voltage of the switchable bias voltage sources 118, 128 are shifted to a voltage level that ensures that the steering diodes 112, 122 conduct and pulls the signal on the input line 130 out of range.

Thus, during a lightning protection circuit 100 functionality test, the switchable bias voltage source 118 of the first example is switched from providing a positive bias voltage to a negative bias voltage for the duration of the test. Similarly, in the first example, the negative bias voltage source 128 switches from a negative bias voltage to a positive bias voltage for the duration of the test. The controller 160 can be any external controller, such as a controller for the protected electronic control system 20, or a dedicated lightning protection controller 160.

Also connected to the node connecting each of the transient voltage suppression diodes 114, 124 to the corresponding steering diode 112, 122 is a voltage sensor 116, 126. The voltage sensor 116, 126 senses the voltage at the input of the transient voltage suppression diode 114, 124 and provides the sensed voltage to the controller 160. The sensed voltage is referred to herein as a "transient voltage suppression wraparound voltage." The controller 160 uses the transient voltage suppression wraparound voltage and the voltage sensed by the external sensor 140 to determine the functionality of both the steering diodes 112, 122 and the transient voltage suppression diodes 114, 124 using the process described below with regards to FIG. 4.

Figure 3:
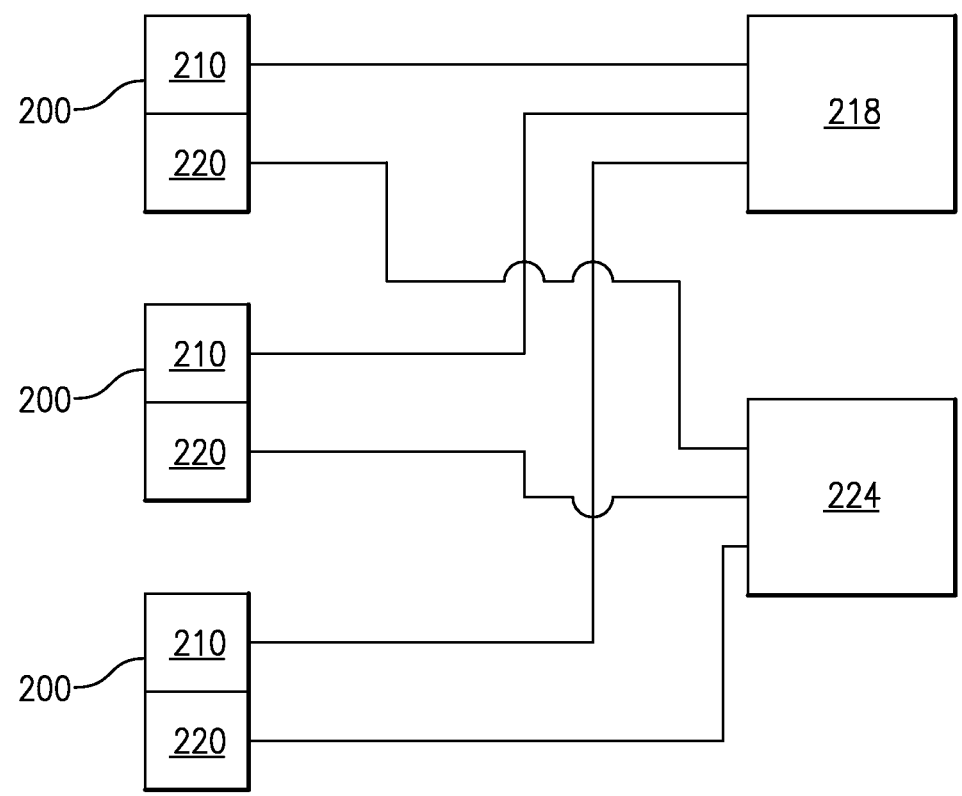
FIG. 3 schematically illustrates multiple lightning protection circuits connected to a single positive bias voltage and a single negative bias voltage source.

In some example aircraft 10, multiple lightning protection circuits 30 are utilized to protect multiple different electronic control system 20, with each lightning protection circuit 30 requiring the same bias voltage. FIG. 3 schematically illustrates one such arrangement including three lightning transient protection circuits 200. Each of the lightning transient protection circuits 200 includes a positive branch 210 and a negative branch 220, as in the example circuit of FIG. 2.

Each of the positive branches 210 is connected to a single positive switchable bias voltage source 218. Similarly, each of the negative branches 220 is connected to a single negative switchable bias voltage source 224. In such a configuration, all of the lightning protection circuits 200 sharing bias voltage sources 218, 224 undergo functionality testing at the same time. It is further understood that additional lightning protection circuits 200 beyond three can similarly be connected to the bias voltage sources 218, 224 and retain functionality.

With reference to FIG. 2, the transient voltage suppression diodes 114, 124 are ordinarily biased on and the controller 160 can test the functionality of the transient voltage suppression diodes 114, 124 as well as testing the connection between the bias resistor 119, 129 and the bias voltage source 118, 128 using conventional means without removing the lightning protection circuit 100. The conventional testing means do not, however, include a way of verifying the functionality of the steering diode 112, 122.

Figure 4:
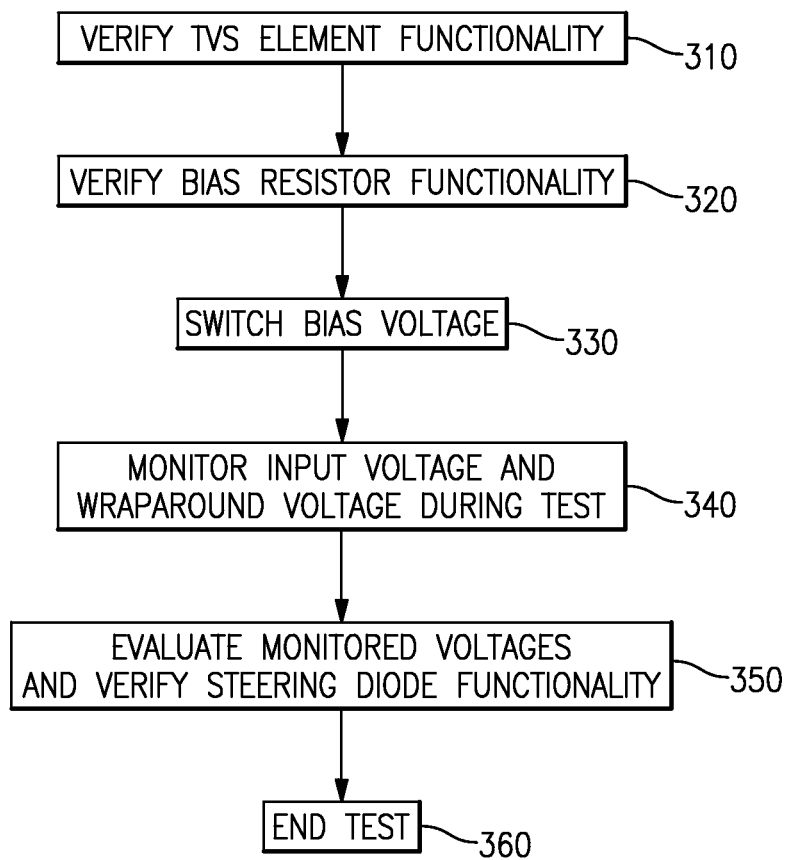
FIG. 4 is a flowchart illustrating a method of testing the functionality of the lightning protection device of FIG. 2.

FIG. 4 illustrates a flow chart demonstrating a method by which the lightning protection circuit 100 of FIG. 2 verifies the functionality of the transient voltage protection diodes 114, 124, the steering diode 112, 122, and the bias resistors 119, 129, thereby testing the full functionality of the lightning protection circuit 100 without removing the lightning protection circuit 100 from the aircraft 10.

Initially, the controller 160 verifies the functionality of the transient voltage suppression diodes 114, 124 and the bias resistors 119, 129 using conventional functionality testing means in a "Verify TVS Element Functionality" step 310 and a "Verify Bias Resistor Functionality" step 320. Once the controller 160 has verified the functionality of the transient voltage suppression diodes 114, 124 and the bias resistors 119, 129, the controller 160 switches the switchable bias voltage supplies in a "Switch Bias Voltage" step 330. The bias voltage switching is accomplished in one example by sending an active command from the controller 160 to the switchable bias voltage supply 118, 128, thereby inverting the bias voltage provided by the switchable bias voltage supply 118, 128. In an alternate example, each branch 110, 120 of the lightning protection circuit 100 is physically connected to a different bias voltage supply, providing the inverted bias voltage, in response to the active command.

Once switched, the controller 160 monitors the input voltage of the lightning protection circuit 100 using the external sensor 140 and the wraparound voltage using the internal voltage sensor 116, 126 in a "Monitor Input Voltage and Wraparound Voltage During Test" step 340. In a fully functioning lightning protection circuit 100, as long as the input voltage remains at a voltage such that the steering diodes 112, 122 will conduct, the steering diode 112, 122 conducts and the transient voltage suppression wraparound voltage measured by the voltage sensors 116, 126 will be low. By way of example, if the transient voltage suppression element 32 has a clamp value of −6.4V (negative 6.4 volts), then the transient voltage suppression wraparound voltage will be −6.4V (negative 6.4 volts) during the test as long as the steering diode 112, 122 is functional.

Once the testing of the functionality of the steering diode 112, 122 is completed, the controller 160 evaluates the monitored voltages and verifies the functionality of the steering diodes 112, 122 in a "Evaluate Monitored Voltages and Verify Steering Diode Functionality" step 350, and ends the test in an "End Test" step 360. If the controller 160 detects that any of the transient voltage suppression diodes 114, 124, the steering diodes 112, 122, or the bias resistors 119, 129 are not functioning during the test, the controller 160 can diagnose the cause of the failure based on multiple potential outputs determined during design of the particular lightning protection circuit 100.

When the controller 160 detects a failure during the functionality test illustrated in FIG. 4, and described above, there are multiple possible causes for the failure. By analyzing the sensor readings of the external sensor 140 and the wraparound voltage sensor 116, 126 over the course of the test, the controller 160 can narrow the particular failure to a limited number of failure modes.

By way of example, if the input voltage, measured by the external sensor 140, and the negative branch 120 of the lightning protection circuit 100 stay always positive during the "Verify TVS Element Functionality" step 310 and the "Verify Bias Resistor Functionality" step 320, then the negative bias voltage 128 source has failed in a low voltage position. Similarly, if the TVS element of the negative branch 120 does not go positive during the "Monitor Input Voltage and Wraparound Voltage During Test" step 340, then the negative bias voltage source 128 has either failed open, includes a short circuit, or failed in a high voltage position.

If the wraparound voltage of a given branch 110, 120 is always the same as the output of the corresponding bias voltage source 118, 128, then the corresponding bias resistor 119, 129 is short circuited. If the input voltage and the wraparound voltage measurements do not go positive in the positive branch 110 then the bias resistor 119 has failed open. Similarly, if the input voltage and the wraparound voltage measurements do not go negative in the negative branch 120 then the bias resistor 129 has failed open.

The preceding are non-limiting examples of various determinations that can be made by the controller 160 based on the measurements of the external sensor 140 and the wraparound voltage sensor 116, 126 for the specific example lightning protection circuit 100 illustrated in FIG. 2, it is understood that similar detection capabilities exist for similar lightning protection circuits 100. The particular conditions for a given failure mode are determined in a lab environment and programmed into a look up table contained within a memory on the controller 160. In this way the controller 160 can determine a particular failure mode, based on the specific sensor 140, 116, 126 readings, or narrow the possible failure modes, and provide the determined information to a maintenance personnel when a failure is detected.

In one example, the preceding method is performed during initialization of the aircraft 10 (illustrated in FIG. 1), and takes minimal time. As such, a lightning protection circuit 100 according to the instant description can be tested and validated prior to each flight without requiring the lightning protection module to be removed from the aircraft.

While the above disclosure is described with regards to inverting the output voltage of the switchable bias voltage sources 118, 128, a similar process can be utilized by shifting the output voltage of the switchable bias voltage sources 118, 128 to any voltage level that ensures that the steering diodes 112, 122 conduct and pulls the signal on the input line 130 out of range when read by the external sensor 140, and a true inversion of the output voltage of the bias voltage source 118, 128 is not necessary.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A lightning protection circuit comprising:
a first lightning protection branch including at least one transient voltage suppression (TVS) protection element, and a testing element integral to said lightning protection circuit, wherein said testing element is operable to test a functionality of the lightning protection circuit while said lightning protection circuit is installed in an electronic control system; and
a controller connected to said testing element, such that said controller receives sensed signals from said testing element.

2. The lightning protection circuit of claim 1, wherein said testing element comprises a wraparound voltage sensor connected to an input node of said transient voltage suppression element and an input voltage sensor connected to an input of said lightning protection circuit.

3. The lightning protection circuit of claim 2, wherein each of said wraparound voltage sensor and said input voltage sensor include a sensed voltage output, and wherein each of said sensed voltage outputs is connected to a corresponding input of said controller.

4. The lightning protection circuit of claim 1, further comprising a switchable bias voltage source connected to said transient voltage suppression element and operable to provide a bias voltage to said transient voltage suppression protection element.

5. The lightning protection circuit of claim 4, wherein said switchable bias voltage source is further connected to said controller, and generates an inverted bias voltage in response to a protection circuit functionality test in progress signal from said controller.

6. The lightning protection circuit of claim 1, wherein said controller further comprises a memory storing a lookup table, said memory further storing instructions for determining a particular set of failure modes based on sensed values during a functionality test using said look up table.

7. The lightning protection circuit of claim 1, further comprising a second branch including at least one transient voltage suppression protection element, and a testing element integral to said lightning protection circuit, wherein said testing element is operable to test a functionality of the lightning protection circuit while said lightning protection circuit is installed in an electronic control system.

8. The lightning protection circuit of claim 7, further comprising:
said first branch including a steering diode connecting said first branch to a lightning protection circuit input via a steering diode anode; and
said second branch including a steering diode connecting said second branch to a lightning protection circuit via a steering diode cathode.

9. The lightning protection circuit of claim 8, wherein said transient voltage suppression element in said first branch is connected to a positive switchable bias voltage source, and said positive switchable bias voltage source provides a negative bias voltage to said transient suppression element during a functionality test.

10. The lightning protection circuit of claim 8, wherein said transient voltage suppression element in said first branch is connected to a negative switchable bias voltage source, and said negative switchable bias voltage source provides a positive bias voltage to transient suppression element during a functionality test.

\* \* \* \* \*